(12) United States Patent
Huang et al.

(10) Patent No.: US 7,365,983 B2
(45) Date of Patent: Apr. 29, 2008

(54) GREASE PROTECTING APPARATUS FOR HEAT SINK

(75) Inventors: Shu-Liang Huang, Guangdong (CN); Yeu-Lih Lin, Guangdong (CN); Ai-Min Huang, Guangdong (CN); Ming Yang, Guangdong (CN)

(73) Assignees: Fu Zhun Precision Industry (Shen Zhen) Co., Ltd., Longhua Town, Bao'an District, Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 203 days.

(21) Appl. No.: 11/163,902

(22) Filed: Nov. 3, 2005

(65) Prior Publication Data
US 2006/0268520 A1 Nov. 30, 2006

(30) Foreign Application Priority Data
May 24, 2005 (CN) .................. 2005 2 0058942 U

(51) Int. Cl.
*H05K 7/20* (2006.01)
*F28F 7/00* (2006.01)
*H01L 23/34* (2006.01)

(52) U.S. Cl. .................. 361/704; 165/80.2; 165/80.3; 165/185; 257/719; 361/707; 361/708; 361/710; 361/690

(58) Field of Classification Search .................. None
See application file for complete search history.

(56) References Cited

U.S. PATENT DOCUMENTS

| | | | |
|---|---|---|---|
| 5,132,875 A * | 7/1992 | Plesinger .................... | 361/704 |
| 5,897,917 A | 4/1999 | Hinshaw et al. | |
| 6,029,740 A | 2/2000 | Lee et al. | |
| 6,049,458 A | 4/2000 | Lee et al. | |
| 6,935,420 B1 * | 8/2005 | Dong et al. .................. | 165/185 |
| 6,952,348 B2 * | 10/2005 | Wu ............................. | 361/719 |
| 7,051,790 B2 * | 5/2006 | Lin ............................. | 165/80.2 |
| 7,063,136 B2 * | 6/2006 | Yu et al. ...................... | 165/185 |
| 7,068,514 B2 * | 6/2006 | Chang et al. ................ | 361/705 |
| 2006/0042787 A1 * | 3/2006 | Yu et al. ...................... | 165/185 |
| 2006/0232936 A1 * | 10/2006 | Wu ............................. | 361/704 |

* cited by examiner

*Primary Examiner*—Gregory D Thompson
(74) *Attorney, Agent, or Firm*—Winston Hsu

(57) ABSTRACT

A grease protecting apparatus (10) includes a heat sink (12) defining a plurality of receiving cavities (124) therein, a layer of grease (16) spread on a surface (122) of the heat sink, and a grease cover (14) attached to the surface of the heat sink for protecting the grease from contamination. The cover includes a main body (142) defining a protecting space (143) therein for covering the grease, two wings (144) extending from two opposite sides of the main body, and a plurality of projections (148) extending from the wings for being snapped in the receiving cavities of the heat sink. The projection has a trapezium-shaped cross section.

17 Claims, 6 Drawing Sheets

GREASE PROTECTING APPARATUS FOR HEAT SINK

FIELD OF THE INVENTION

The present invention relates generally to a grease protecting apparatus, and particularly to a grease protecting cover for separating the grease from surrounding articles.

DESCRIPTION OF RELATED ART

A layer of thermal grease is usually spread on a bottom surface of a heat sink to improve heat conductivity between the heat sink and an electronic heat-generating component. The heat generated by the electronic component causes the thermal grease to become more viscous, making the thermal grease fill in air gaps formed between the heat sink and the electronic component, thereby improving heat conductivity between the heat sink and the electronic component.

Since the thermal grease is not solid at ambient temperature, it may contaminate surrounding articles or be contaminated by dust or foreign particles before the heat sink is assembled to the electronic component. So a grease protecting cover is needed to separate the thermal grease from the surrounding articles, for preventing the thermal grease from contaminating surrounding articles or being contaminated by dust or foreign particles.

Conventionally, a grease protecting cover used for separating the thermal grease from the surrounding articles includes a main body, a protecting space formed at a middle portion of the main body for separating the thermal grease from the surrounding articles, and two wings horizontally extending from two opposite sides of the main body. In order to attach the cover onto the heat sink, a layer of adhesive is affixed to each of the wings of the cover. This may cause the cover to fall off the heat sink in case the adhesive have not enough stickiness. So a grease protecting cover had a firm connection with the heat sink is needed.

SUMMARY OF INVENTION

The present invention relates to a grease protecting apparatus. According to a preferred embodiment of the present invention, the grease protecting apparatus includes a heat sink defining a plurality of receiving cavities therein, a layer of thermal grease spread on a surface of the heat sink, and a grease cover attached to the surface of the heat sink and covering the grease for protecting the grease from contamination. The cover includes a main body defining a protecting space therein for covering the grease, two wings extending from two opposite sides of the main body, and two projections extending from the wings, respectively, for being snapped in the receiving cavities of the heat sink. The projections each have a trapezium-shaped cross section with a narrow upper portion and a wider bottom portion. The cavities each have a cross section corresponding to that of the projection.

Other advantages and novel features of the present invention will become more apparent from the following detailed description of preferred embodiment when taken in conjunction with the accompanying drawings, in which:

DETAILED DESCRIPTION

Figure 1:
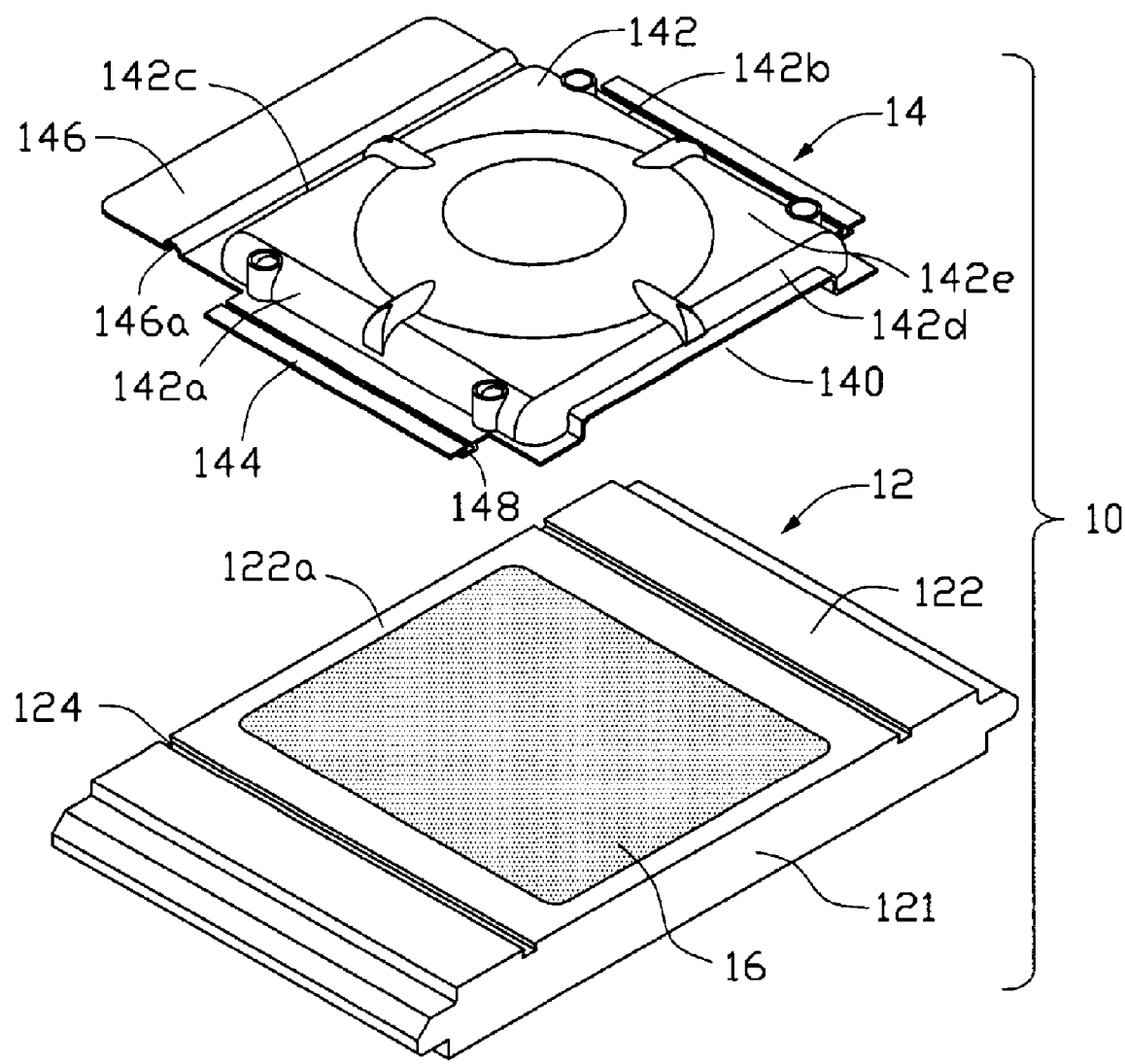
FIG. 1 is an exploded, isometric view of a grease protecting apparatus according to a preferred embodiment of the present invention.
Figure 2:
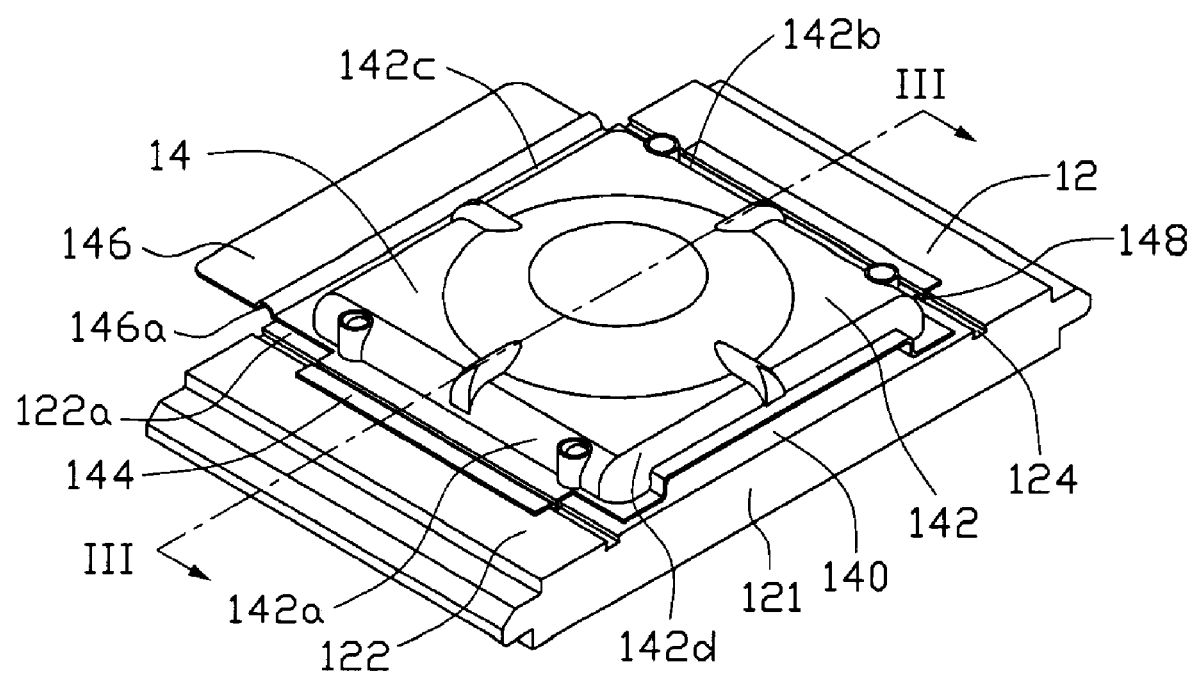
FIG. 2 is an assembled view of the grease protecting apparatus of FIG. 1.
Figure 3:
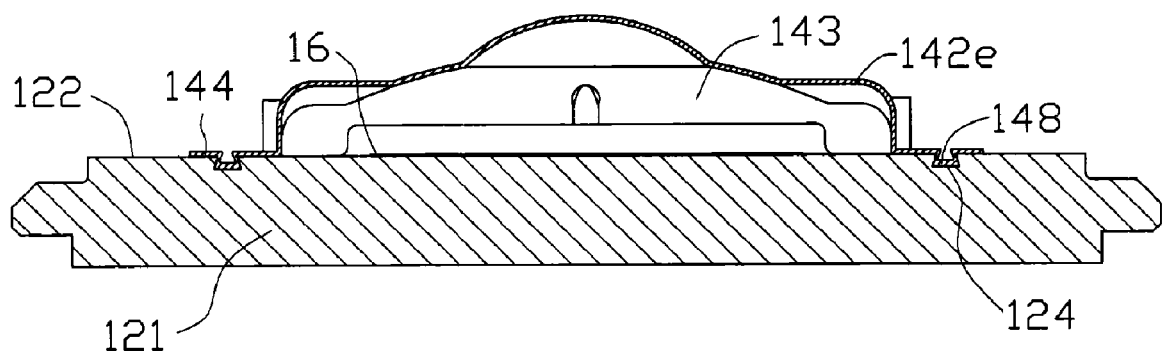
FIG. 3 is a cross-sectional view take along line III-III of FIG. 2.

Referring to FIGS. 1 to 3, a grease protecting apparatus 10 according to a preferred embodiment of the present invention includes a heat sink 12, and a grease cover 14. A layer of thermal grease 16 is spread on a middle portion of a bottom surface 122 of the heat sink 12, for improving heat conductivity between the heat sink 12 and an electronic heat-generating component (not shown) to which the heat sink 12 is to be mounted for absorbing heat therefrom. The cover 14 is attached to the bottom surface 122 of the heat sink 12, for enclosing the thermal grease 16, thereby preventing the thermal grease 16 from contaminating surrounding articles or being contaminated by dust or foreign articles.

The grease cover 14 is made of plastics materials, and includes a rectangular main body 142 with four sidewalls 142a, 142b, 142c, and 142d disposed around four sides of a top cover 142e of the main body 142, respectively, two wings 144 horizontally extending from the two opposite sidewalls 142a, 142b of the main body 142, a flange 146 horizontally extending from the sidewall 142c of the main body 142, and a projection such as a rib 148 vertically downwardly extending from a bottom surface of each of the wings 144.

The main body 142 forms a protecting space 143 enclosed by the four sidewalls 142a, 142b, 142c, 142d below the top cover 142e of the main body 142. The protecting space 143 is above the bottom surfaces of the wings 144 for accommodating the thermal grease 16, whereby the grease cover 14 separates the thermal grease 16 from surrounding environment. A small cutout 140 is defined in the sidewall 142d opposite the flange 146 of the main body 142. The cutout 140 makes the sidewall 142d of the main body 142 of the cover 14 separate from the thermal grease 16 spread on the heat sink 12, thereby preventing the thermal grease 16 from being unintentionally scraped off by the sidewall 142d of the main body 142 of the cover 14 when the cover 14 is mounted to the bottom surface 122 of the heat sink 12 or detached therefrom.

When the grease cover 14 is mounted on the heat sink 12, the flange 146 is located outside a side 122a of the heat sink 12, so that a user can easily grasp the flange 146 to exert a force to the cover 14 to pull the cover 14 away from the heat sink 12. After the cover 14 is removed, the thermal grease 16 is exposed and the heat sink 12 is ready to be mounted to the electronic heat-generating component. A ripple 146a is formed on the flange 146 at a side thereof adjacent to the sidewall 142c of the main body 142. The ripple 146a makes the flange 146 be capable of being tilted upwardly, away from the bottom surface 122 of heat sink 12, so that the user can easily grasp the flange 146.

The two ribs 148 are elongate and formed on the wings 144 of the cover 14, respectively. Each of the ribs 148 has a trapezium-shaped cross section. This makes a width of the cross section of each of the ribs 148 be gradually increased from a top portion adjacent to the main body 142 toward a bottom portion away from the main body 142.

Particularly referring to FIG. 1, the heat sink 12 includes a base 121. The base 121 defines two receiving grooves, cavities or recesses 124 in the bottom surface 122 corresponding to the ribs 148. The cross section of each of the receiving grooves 124 is also trapezium-shaped, corresponding to that of the rib 148, so that a width of each of the receiving grooves 124 is gradually increased from a top end adjacent to the cover 14 to a bottom end away from the cover 14. Thus, when the cover 14 is mounted on the bottom surface 122 of the heat sink 12 by fitting the ribs 148 in the receiving grooves 124, respectively, the cover 14 will not automatically fall from the heat sink 12 since the bottom portions of the ribs 148 are blocked by slanted walls of the heat sink 12 defining the receiving grooves 124. By the design that the cover 14 has the trapezoid cross-sectioned ribs 148 fitted in trapezoid cross-sectioned receiving grooves 124 of the heat sink 12, the cover 14 can be securely mounted on the heat sink 12 to reliably protect the grease 16 if no manual manipulation is made to the flange 146 in order to remove the cover 14 from the heat sink 12.

Particularly referring to FIG. 2, in assembly of the grease protecting apparatus 10, the grease cover 14 is put on the base 121 of the heat sink 12, with the ribs 148 of the cover 14 being received in the corresponding receiving grooves 124 of the base 121 of the heat sink 12 at one end of each of the receiving grooves 124, and the cutout 140 of the cover 14 being positioned on the side 122a of the bottom surface 122 of the heat sink 12 and facing the thermal grease 16 spread on the heat sink 12. Then, the grease cover 14 is pushed toward the other ends of the receiving grooves 124 of the base 121 of the heat sink 12, until the ribs 148 of the grease cover 14 are entirely snapped in the receiving grooves 124 of the base 121 of the heat sink 12, thereby firmly mounting the grease cover 14 on the base 121 of the heat sink 12.

In disassembly of the grease protecting apparatus 10, a force is exerted on the flange 146 of the cover 14 for pulling the ribs 148 of the cover 14 out of the receiving grooves 124 of the base 121 of the heat sink 12, thereby taking the cover 14 off the base 121 of the heat sink 12.

In this embodiment of the invention, the cover 14 is attached to the heat sink 12 via a snap between the ribs 148 and the slantingly sidewalls of the receiving grooves 124 of the heat sink 12. This enables the cover 14 to be securely attached to the heat sink 12, without the necessity of applying a layer of adhesive on each of the wings 144 of the cover 14. Accordingly, the grease protecting apparatus 10 in accordance with the present invention can more conveniently protect the grease 16 than the prior art.

In a modification of this embodiment, the ribs 148 of the grease cover 14 can be divided into several small pieces. These small pieces can also be snapped in the receiving grooves 124, which causes that the cover 14 can be firmly mounted on the base 121 of the heat sink 12.

Figure 4:
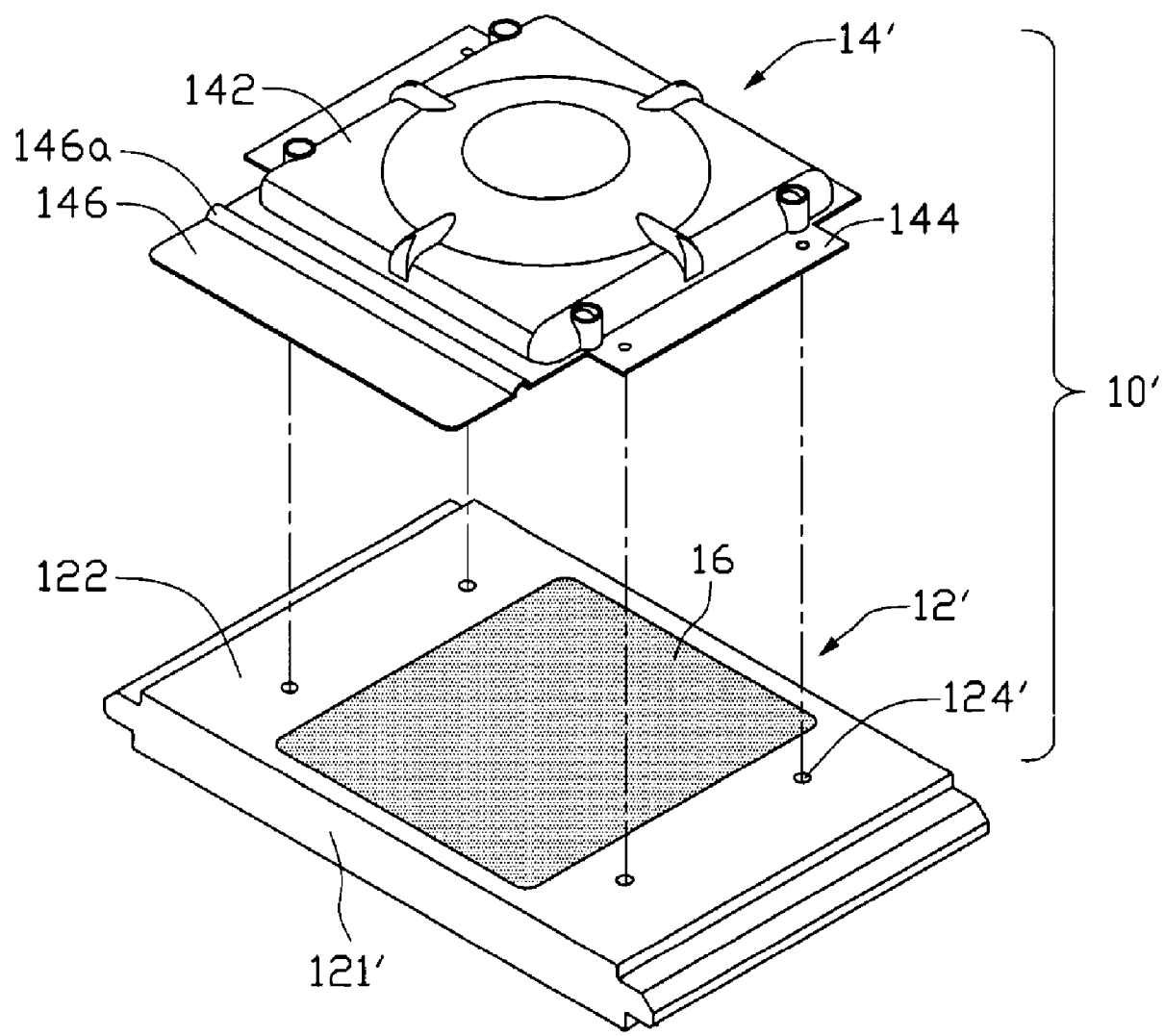
FIG. 4 is an exploded, isometric view of the grease protecting apparatus according to another embodiment of the present invention.
Figure 5:
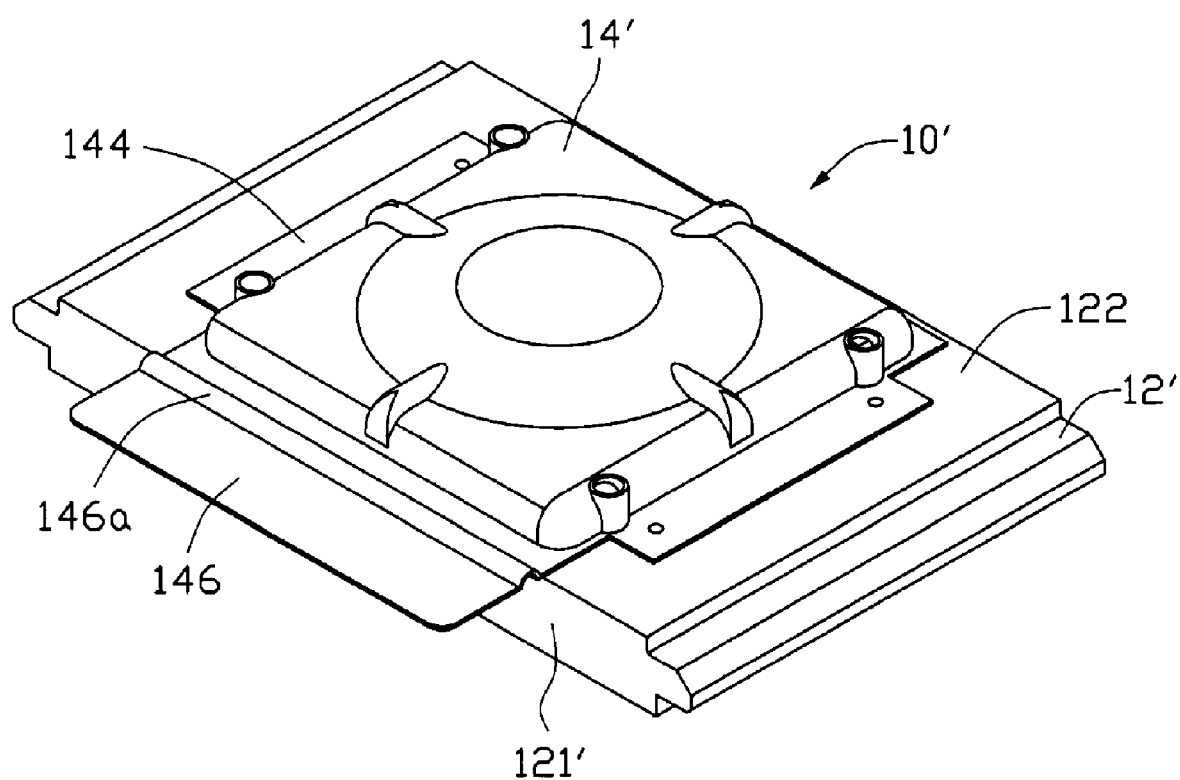
FIG. 5 is an assembled view of the grease protecting apparatus of FIG. 4.
Figure 6:
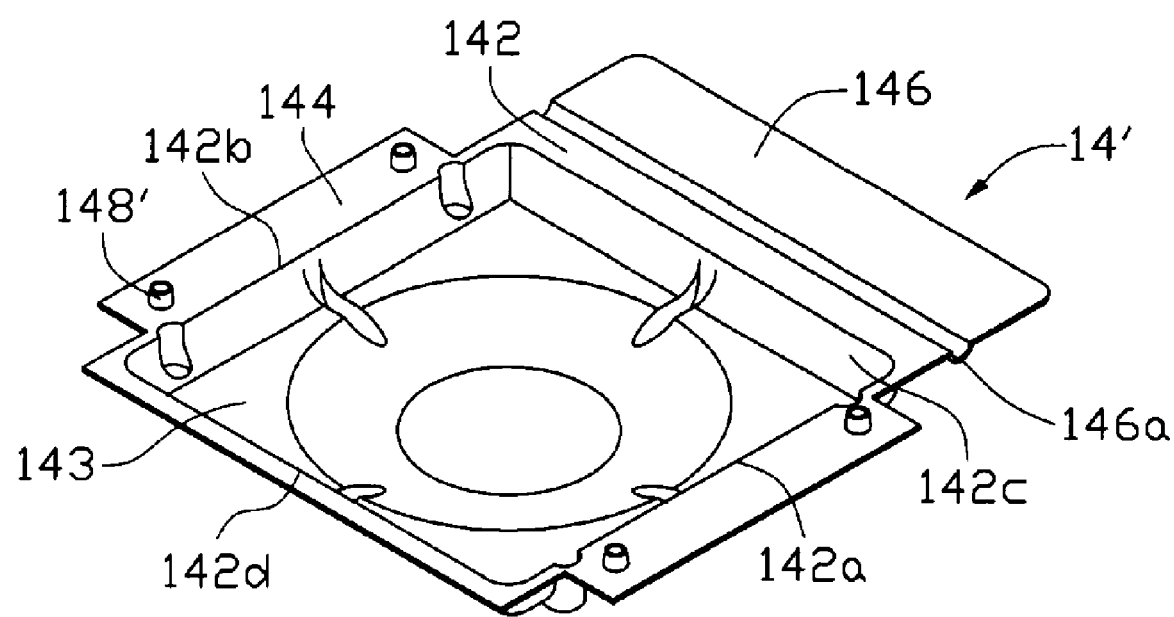
FIG. 6 is an isometric view of a grease cover of the grease protecting apparatus of FIG. 4, viewed from a different aspect.

Referring to FIGS. 4 and 6, a grease protecting apparatus 10' according to a second embodiment of the present invention is shown. In this embodiment, projections of the grease cover 14' are a plurality of conical poles 148'. The conical pole 148' has a circular cross section. A diameter of each of the poles 148' is gradually decreased from a top portion adjacent to the main body 142 to a bottom portion away from the main body 142. In this embodiment, the base 121' of the heat sink 12' defines a plurality of conical receiving holes 124' therein corresponding to the poles 148' of the cover 14'. A diameter of each of the receiving holes 124' is gradually decreased from a top end adjacent to the bottom surface 122 of the heat sink 12' to a bottom end away from the bottom surface 122 of the heat sink 12'.

In assembly of the grease protecting apparatus 10', the cover 14' is put on the heat sink 12', with the bottom ends of the poles 148' of the cover 14' being received in the top ends of the receiving holes 124' of the base 121' of the heat sink 12', respectively. Then, the cover 14' is pressed toward the bottom surface 122 of the heat sink 12' until the top ends of the poles 148' reach the bottom ends of the receiving holes 124'. At this position, outer surfaces of the poles 148' of the cover 14' engagingly abut against sidewalls of the receiving holes 124' of the base 121' of the heat sink 12', thereby firmly mounting the cover 14' to the heat sink 12'. Because the outer surfaces of the poles 148' of the cover 14' engagingly abut against sidewalls of the receiving holes 124' of the base 121' of the heat sink 12', a friction force is produced between the outer surfaces of the poles 148' and the corresponding sidewalls of the receiving holes 124', which can prevent the cover 14' from being automatically falling from the heat sink 12'.

In disassembly of the grease protecting apparatus 10', a larger force in a direction away from the bottom surface 122 of the heat sink 12' is exerted on the flange 146 of the cover 14'. The force makes the poles 148' of the cover 14' leave the holes 124' of the heat sink 12', whereby the cover 14' is peeled from the heat sink 12' to expose the grease 16.

According to the second embodiment of the invention, during the assembly of the grease protecting apparatus 10', the bottom ends of the poles 148' are firstly received in the top ends of receiving holes 124', respectively. Because a diameter of the top end of each of the receiving holes 124' is larger than a diameter of the bottom end of the corresponding pole 148', the bottom ends of the poles 148' can be easily received in the top ends of the receiving holes 124', respectively, thereby facilitating the attachment of the cover 14' to the heat sink 12'.

In the second embodiment, each of the poles 148' may have another shape regarding its cross section, such as triangle or square, with each of the receiving holes 124' having a shape of cross section corresponding to that of the pole 148'.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A grease protecting cover adapted for protecting grease spread on a bottom surface of a heat sink, the heat sink defining a plurality of receiving cavities therein, and the grease protecting cover comprising:
   a main body defining a protecting space therein, adapted for receiving the grease; and
   a plurality of projections extending from the main body, adapted for being snapped in the receiving cavities of the heat sink, a portion of each of the projections adjacent to the main body having a different width with another portion of the projection away from the main body;

wherein two wings are extended from opposite sides of the main body, the projections are extended from bottom surfaces of the wings, respectively; and wherein a flange is extended between the two opposite sides of the main body.

2. The grease protecting cover as described in claim 1, wherein the projections comprise a rib formed on each of the wings.

3. The grease protecting cover as described in claim 2, wherein a width of the portion of each of the ribs adjacent to the main body is smaller than a width of the portion of the rib away from the main body.

4. The grease protecting cover as described in claim 1, wherein the projections are a plurality of poles.

5. The grease protecting cover as described in claim 4, wherein a width of the portion of each of the poles adjacent to the main body is larger than a width of the portion of the pole away from the main body.

6. The grease protecting cover as described in claim 1, wherein the main body forms a ripple on the flange to make the flange be capable of being tilted upwardly.

7. The grease protecting cover as described in claim 1, wherein the main body defines a cutout at a side opposite to the flange to make the side of the main body opposite the flange separate from the thermal grease spread on the heat sink.

8. A grease protecting apparatus comprising:
a heat sink with a plurality of receiving cavities defined therein;
a layer of grease spread on a surface of the heat sink, the surface being adapted for contacting with a heat generating component;
a grease cover attached with the surface of the heat sink and covering the grease to protect the grease from contamination, the cover comprising:
a main body defining a protecting space therein for covering the grease;
two wings extending from two opposite sides of the main body; and
a plurality of projections extending from the wings, for being snapped in the receiving cavities of the heat sink, a portion of each of the projections adjacent to the main body having a different width with another portion of the projection away from the main body.

9. The grease protecting apparatus as described in claim 8, wherein the projections comprise a rib extending from each of the wings.

10. The grease protecting apparatus as described in claim 9, wherein a width of cross section of each of the ribs is gradually increased from the portion adjacent to the main body to the portion away from the main body.

11. The grease protecting apparatus as described in claim 8, wherein the projections are a plurality of poles vertically extending from the wings.

12. The grease protecting apparatus as described in claim 11, wherein the poles each have a conical shape.

13. The grease protecting apparatus as described in claim 11, wherein a cross section of each of the poles has one of the shapes of circular, triangle and square.

14. The grease protecting apparatus as described in claim 12, wherein outer surfaces of the poles of the cover abut against sidewalls of the receiving cavities.

15. A heat sink assembly, comprising:
a heat sink having a bottom face for contacting with a heat-generating electronic component;
grease spread on the bottom face, the bottom face of the heat sink defining recesses therein;
a protective cover attached to the bottom face of the heat sink and covering the grease, the protective cover having protrusions fitted in the recesses;
wherein the protective cover has two wings on two opposite sides thereof, respectively, the protrusions being formed on the two wings, a flange extending between the two wings, and a ripple being formed on the flange so that the flange can be tilted upwardly to conveniently receive a force for applying on the cover for separating the cover from the heat sink to expose the grease.

16. The heat sink assembly of claim 15, wherein the recesses are two grooves in the bottom face of the heat sink, and the protrusions are two ribs.

17. The heat sink assembly of claim 15, wherein the recesses are a plurality of conical holes in the bottom surface of the heat sink, and the protrusions are a plurality of conical poles.

* * * * *